US010418406B2

(12) United States Patent
Kilcoyne et al.

(10) Patent No.: US 10,418,406 B2
(45) Date of Patent: Sep. 17, 2019

(54) HYBRID SENSOR CHIP ASSEMBLY AND METHOD FOR REDUCING RADIATIVE TRANSFER BETWEEN A DETECTOR AND READ-OUT INTEGRATED CIRCUIT

(71) Applicant: RAYTHEON COMPANY, Waltham, MA (US)

(72) Inventors: Sean P. Kilcoyne, Lompoc, CA (US); John L. Vampola, Santa Barbara, CA (US); Barry M. Starr, Santa Barbara, CA (US); Chad W. Fulk, Ventura, CA (US); Christopher L. Mears, Boulder, CO (US); John J. Drab, Santa Barbara, CA (US)

(73) Assignee: RAYTHEON COMPANY, Waltham, MA (US)

( * ) Notice: Subject to any disclaimer, the term of this patent is extended or adjusted under 35 U.S.C. 154(b) by 0 days.

(21) Appl. No.: 15/856,747

(22) Filed: Dec. 28, 2017

(65) Prior Publication Data
US 2018/0190705 A1    Jul. 5, 2018

Related U.S. Application Data

(60) Provisional application No. 62/439,934, filed on Dec. 29, 2016.

(51) Int. Cl.
*H01L 27/146* (2006.01)
*H01L 21/768* (2006.01)
*H01L 21/302* (2006.01)

(52) U.S. Cl.
CPC ...... *H01L 27/14636* (2013.01); *H01L 21/302* (2013.01); *H01L 21/76877* (2013.01);
(Continued)

(58) Field of Classification Search
CPC ......... H01L 27/14623; H01L 27/14643; H01L 27/14634
See application file for complete search history.

(56) References Cited

U.S. PATENT DOCUMENTS

| 2012/0105696 A1 | 5/2012 | Maeda |
| 2014/0284745 A1 | 9/2014 | Seta |
| 2016/0190198 A1 | 6/2016 | Kwon et al. |

FOREIGN PATENT DOCUMENTS

EP    1653515 A1    5/2006

OTHER PUBLICATIONS

Spieler, "Introduction to Radiation-Resistant Semiconductor Devices and Circuits", (1996).
(Continued)

*Primary Examiner* — Douglas M Menz
(74) *Attorney, Agent, or Firm* — Lando & Anastasi, LLP (57) ABSTRACT

Aspects and examples described herein provide a hybrid imaging sensor chip assembly for reducing undesired radiative transfer between a complementary metal-oxide semiconductor (CMOS) read-out integrated circuit (ROIC) and an optical detector, and methods of manufacturing a hybrid imaging sensor chip assembly. In one example, a hybrid imaging sensor chip assembly includes an optical detector configured to collect electromagnetic radiation incident thereon, a complementary metal-oxide semiconductor (CMOS) read-out integrated circuit (ROIC), and a radiation-shielding wafer interposed between the optical detector and the CMOS ROIC, the radiation-shielding wafer including a plurality of through wafer vias (TWVs) electrically coupled to the optical detector and the CMOS ROIC, the radiation-shielding wafer being positioned to prevent radiative transfer between the CMOS ROIC and the optical detector.

19 Claims, 5 Drawing Sheets

(52) U.S. Cl.
CPC .... *H01L 27/1469* (2013.01); *H01L 27/14623* (2013.01); *H01L 27/14634* (2013.01); *H01L 27/14643* (2013.01); *H01L 27/14687* (2013.01)

(56) References Cited

OTHER PUBLICATIONS

Cloutier et al., "Optical gain and stimulated emission in periodic nanopatterned crystalline silicon", Nature Materials (2005), pp. 1-5.
Kobitski et al., "Self-trapped exciton recombination in silicon nanocrystals", Physical Review B (2001) vol. 63, No. 11, pp. 1-5.
International Search Report and Written Opinion for application No. PCT/US2017/068719 dated Mar. 27, 2018.

HYBRID SENSOR CHIP ASSEMBLY AND METHOD FOR REDUCING RADIATIVE TRANSFER BETWEEN A DETECTOR AND READ-OUT INTEGRATED CIRCUIT

CROSS-REFERENCE TO RELATED APPLICATION

This application claims priority under 35 U.S.C. § 119(e) to U.S. Provisional Application Ser. No. 62/439,934, titled "HYBRID SENSOR CHIP ASSEMBLY AND METHOD FOR REDUCING RADIATIVE EMISSION," filed on Dec. 29, 2016, which is hereby incorporated herein by reference in its entirety.

BACKGROUND

During normal operating conditions of a hybrid imaging sensor chip assembly (SCA), light is passed through a front-end optical system such that it forms an image incident upon an SCA detector. This incident light on the SCA may be a direct image of a scene or object of interest, or it may be a spectrographic image showing the spectral distribution of energy of a scene or object. The incident light on the SCA is absorbed by the detector and creates an electrical charge within the detector material, which is collected, processed, and passed to external circuitry by a read-out integrated circuit (ROIC).

In some instances, a complementary metal-oxide semiconductor (CMOS) ROIC within a SCA may generate a small, but significant, amount of radiative emission (i.e., "glow"). The radiative emission from CMOS ROICs is a fundamental property of metal-oxide-semiconductor field-effect transistor (MOSFET) operation, and may increase when a large number of transistor devices are used within a CMOS ROIC design. When CMOS ROICs are included within a hybrid imaging device, the undesired radiative emission may be absorbed by the detector, and generate undesired signal and noise, which is then collected by the ROIC. While in some applications the resulting ROIC glow may be negligible, in particular for low optical background scientific imaging applications (e.g., spectroscopy and astronomy applications), the undesired radiative emission can have a significant negative impact on device performance.

In other instances, light or high energy radiation may pass through the detector and arrive at the ROIC. Such an occurrence can negatively impact and impair the functionality of the ROIC. For example, these situations may occur when natural high energy radiation sources, such as those found in space-based applications, man-made laser light sources, and radiation sources produced within or outside of the earth's atmosphere, are directed at the hybrid imaging device. In extreme cases, these conditions may even cause temporary or permanent damage to the SCA.

SUMMARY OF THE INVENTION

Aspects and examples are generally directed to a hybrid imaging sensor chip assembly for reducing undesired radiative transfer from a complementary metal-oxide semiconductor (CMOS) read-out integrated circuit (ROIC) to an optical detector, and/or a hybrid imaging sensor chip assembly for reducing radiative transfer from the optical detector to the CMOS ROIC. Methods of manufacturing the same are also described herein. In one example, the sensor chip assembly includes a radiation-shielding layer (e.g., electromagnetic radiation-shielding layer) interposed between the detector and the CMOS ROIC. The radiation-shielding wafer is configured to prevent radiative transfer from the CMOS ROIC to the optical detector, and/or from the optical detector to CMOS ROIC. Specifically, the radiation-shielding wafer may be physically and electrically coupled to the CMOS ROIC and the optical detector using wafer level bonding structures. One or more through wafer vias (TWVs) within the radiation-shielding wafer enable electrical communication between the optical detector and CMOS ROIC, while preventing (e.g., blocking and/or absorbing) undesired radiative transfer between the CMOS ROIC and the optical detector.

According to an aspect, provided is a sensor chip assembly. In one example, the sensor chip assembly comprises an optical detector configured to collect electromagnetic radiation incident thereon, a complementary metal-oxide semiconductor (CMOS) read-out integrated circuit (ROIC), and a radiation-shielding wafer interposed between the optical detector and the CMOS ROIC, the radiation-shielding wafer including a plurality of through wafer vias (TWVs) electrically coupled to the optical detector and the CMOS ROIC, the radiation-shielding wafer being positioned to prevent radiative transfer between the CMOS ROIC and the optical detector.

In various examples, the radiation-shielding wafer is physically coupled to the optical detector and the CMOS ROIC. In some examples, each of the plurality of TWVs includes an etched hole filled with an electrically conductive material within the radiation-shielding wafer to electrically couple the optical detector and the CMOS ROIC. In some particular examples, the electrically conductive material is copper. According to some examples, the plurality of TWVs are arranged in a two-dimensional array within the radiation-shielding wafer.

According to various examples, the radiation-shielding wafer includes a semiconductor absorber deposited on a silicon wafer. In some examples, the semiconductor absorber is composed of at least one of germanium (Ge), indium gallium arsenide (InGaAs), indium arsenide (InAs), indium antimonide (InSb), and mercury cadmium telluride (HgCdTe). According to various examples, the radiation-shielding wafer is configured to prevent radiative transfer within the electromagnetic spectrum. In some particular examples, the radiative transfer includes infrared radiation having a wavelength between 0.8 μm and 2.4 μm.

In various examples, the CMOS ROIC includes a first plurality of electrical connections, the optical detector includes a second plurality of electrical connections, and the plurality of TWVs electrically couple the first plurality of electrical connections of the CMOS ROIC with the second plurality of electrical connections of the optical detector. In some examples, each TWV of the plurality of TWVs is bonded to a corresponding first electrical connection of the first plurality of electrical connections with a first wafer level bonding structure, and each TWV of the plurality of TWVs is bonded to a corresponding second electrical connection of the second plurality of electrical connections with a second wafer level bonding structure. In some examples, the first wafer level boding structure forms a first direct oxide bond and the second wafer level bonding structure forms a second direct oxide bond. In some examples, each TWV of the plurality of TWVs is bonded to the optical detector with an indium bump.

According to an aspect, provided is a method of manufacturing a sensor chip assembly. In one example, the method comprises providing a radiation-shielding wafer including plurality of through wafer vias (TWVs), providing a complementary metal-oxide semiconductor (CMOS) read-out integrated circuit (ROIC), fabricating a first wafer level bonding structure on a first surface of the CMOS ROIC, fabricating a second wafer level bonding structure on a second surface of the radiation-shielding wafer, and forming a first direct oxide bond between the first wafer level bonding structure and the second wafer level bonding structure to electrically and physically couple to the radiation-shielding wafer and the CMOS ROIC.

According to various examples, the method further comprises providing an optical detector configured to collect electromagnetic radiation incident thereon, fabricating a third wafer level bonding structure on a third surface of the radiation-shielding wafer, and fabricating a fourth wafer level bonding structure on a fourth surface of the optical detector. In some examples, the method further comprises forming a second direct oxide bond between the third wafer level bonding structure and the fourth wafer level bonding structure to electrically and physically couple to the radiation-shielding wafer and the optical detector.

In various examples, providing the radiation-shielding wafer includes providing a silicon wafer having a semiconductor absorber deposited thereon, etching a plurality of holes through the radiation-shielding wafer, and filling each hole of the plurality of holes with an electrically conductive material. In some examples, filling each hole of the plurality of holes with an electrically conductive material includes filling each hole with copper. In some examples, etching a plurality of holes through the silicon wafer and the semiconductor absorber includes etching a two-dimensional array of holes. According to various examples, the radiation-shielding wafer is coupled via a silicon-on-insulator interface to a handling wafer, and the method further comprises removing the handling wafer responsive to forming the first direct oxide bond.

Still other aspects, embodiments, and advantages of these exemplary aspects and embodiments are discussed in detail below. Embodiments disclosed herein may be combined with other embodiments in any manner consistent with at least one of the principles disclosed herein, and references to "an embodiment," "some embodiments," "an alternate embodiment," "various embodiments," "one embodiment" or the like are not necessarily mutually exclusive and are intended to indicate that a particular feature, structure, or characteristic described may be included in at least one embodiment. The appearances of such terms herein are not necessarily all referring to the same embodiment. Various aspects and embodiments described herein may include means for performing any of the described methods or functions.

BRIEF DESCRIPTION OF THE DRAWINGS

Various aspects of at least one embodiment are discussed below with reference to the accompanying figures, which are not intended to be drawn to scale. The figures are included to provide illustration and a further understanding of the various aspects and embodiments, and are incorporated in and constitute a part of this specification, but are not intended as a definition of the limits of the invention. In the figures, each identical or nearly identical component that is illustrated in various figures is represented by a like numeral. For purposes of clarity, not every component may be labeled in every figure. In the figures.

DETAILED DESCRIPTION

Aspects and examples are generally directed to a sensor chip assembly for reducing undesired radiative transmission between a detector (e.g. detector layer) and a read-out integrated circuit (ROIC) within an imaging device, and a method of manufacturing a sensor chip assembly. Specifically, aspects and examples prevent the collection of undesired radiative emission (e.g., photon emission from one or more metal-oxide-semiconductor field-effect transistors (MOSFETs)) within a complementary metal-oxide semiconductor read-out integrated circuit (CMOS ROIC) at an optical detector within the imaging device. Aspects and examples further prevent light and other forms of high energy radiation that pass through the optical detector, and that may disrupt the operation of the CMOS ROIC, from reaching the CMOS ROIC. In certain examples, the sensor chip assembly includes a radiation-shielding interposer layer coupled via a wafer level bond between the CMOS ROIC and the optical detector and configured to block, and/or absorb, undesired radiative transmission between the optical detector and the CMOS ROIC.

As discussed above, during normal operating conditions, CMOS ROICs within an imaging device may generate a small, but significant, amount of radiative emission. Modern theories suggest that the radiative emission from the MOSFET devices within the CMOS ROIC occurs through radiative recombination involving both electrons and holes (as in interband radiation), or through radiative transitions involving a single carrier type (as in intraband radiation). Within low background scientific and astronomy imaging devices, the CMOS ROIC MOSFET devices typically consist of nMOS-type and pMOS-type transistors, which are the source of the radiative emission. The emission spectrum of the undesired emission may depend on the type of transistor device (e.g., nMOS-type or pMOS-type), and may be primarily centered at a silicon bandgap of 1.1 µm.

Some typical approaches for reducing the undesired emission of CMOS ROICs have included specially designed CMOS ROIC architectures that limit the number of MOSFETs used in the ROIC and that constrict activation of those MOSFETs during the optical integration period. The dominant architecture for such arrangements includes a three transistor source-follower per detector (SFD) architecture. However, such arrangements do not completely eliminate the undesired radiative emission. Moreover, the three transistor SFD architecture has undesired non-linearity effects in the response of the CMOS ROIC. Other approaches for reducing the undesired radiative emission of CMOS ROICs have included placing a metal layers within the CMOS ROIC to back-reflect the radiative emission. However, implementation of metal layers cannot provide full optical coverage as the optical detector still needs to be electrically connected with the ROIC. Accordingly, these arrangements often include a plurality of unshielded gaps within the metal layer, which allow the radiative emission to leak to the optical detector.

Accordingly, it is desirable that no measurable light passes from the ROIC to the optical detector in a hybrid imaging sensor chip assembly. Further, in many cases, there is a need to prevent light or other forms of high energy radiation from passing through the optical detector and reaching the ROIC. As such, various aspects and examples discussed herein provide an improved structure for preventing the transfer of radiative emission between a CMOS ROIC and an optical detector. In at least one example, a radiation-shielding wafer interposed between the optical detector and the CMOS ROIC allows electrical communication between the CMOS ROIC and the optical detector while also preventing the transfer of the undesired radiative energy. Specifically, the radiation-shielding wafer may include one or more through wafer vias (TWVs) which act as electrical conduits between the optical detector and the CMOS ROIC. Such aspects and examples provide important functionality for numerous low-background applications, such as low-background imaging astronomy applications. For example, such applications may require operation within the less-than 10e$^-$/s optical background region.

It is to be appreciated that embodiments of the methods and apparatuses discussed herein are not limited in application to the details of construction and the arrangement of components set forth in the following description or illustrated in the accompanying drawings. The methods and apparatuses are capable of implementation in other embodiments and of being practiced or of being carried out in various ways. Examples of specific implementations are provided herein for illustrative purposes only and are not intended to be limiting. Also, the phraseology and terminology used herein is for the purpose of description and should not be regarded as limiting. The use herein of "including," "comprising," "having," "containing," "involving," and variations thereof is meant to encompass the items listed thereafter and equivalents thereof as well as additional items. References to "or" may be construed as inclusive so that any terms described using "or" may indicate any of a single, more than one, and all of the described terms. Any references to front and back, left and right, top and bottom, upper and lower, and vertical and horizontal are intended for convenience of description, not to limit the present systems and methods or their components to any one positional or spatial orientation.

Figure 1:
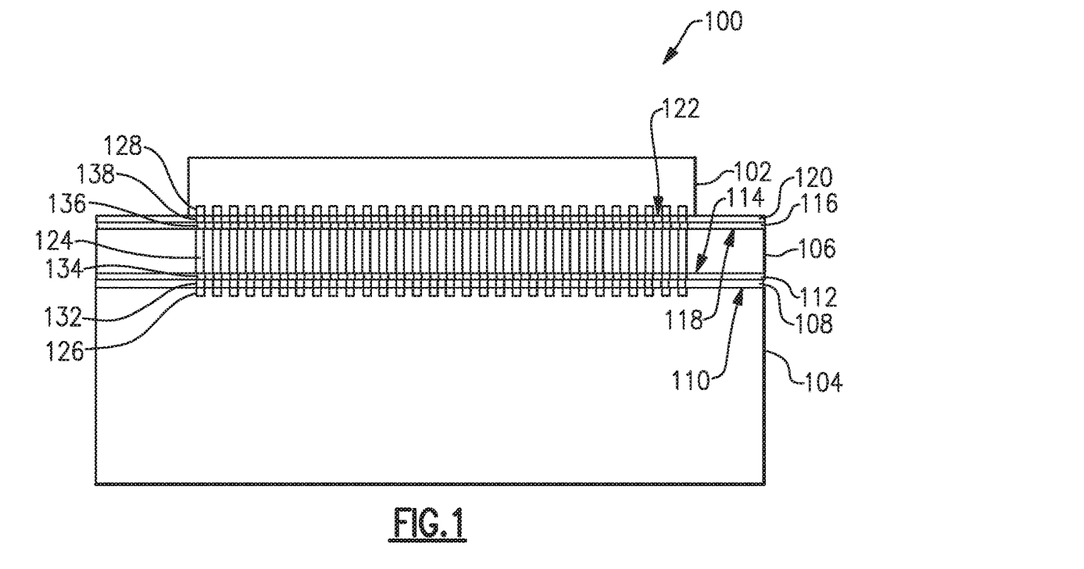
FIG. 1 is an example of a sensor chip assembly according to aspects described herein.

Referring to FIG. 1, shown is an example of a sensor chip assembly 100 according to certain aspects and examples. In the shown example, the sensor chip assembly 100 includes at least an optical detector 102 (e.g., detector layer), a CMOS ROIC 104, and a radiation-shielding wafer 106 interposed there between. The sensor chip assembly 100 may further include a first wafer level bonding structure 108 fabricated on a surface 110 of the CMOS ROIC 104, a second wafer level bonding structure 112 fabricated on a first surface 114 of the radiation-shielding wafer 106, a third wafer level bonding structure 116 fabricated on a second surface 118 of the radiation-shielding wafer 106, and a fourth wafer level bonding structure 120 fabricated on a surface 122 of the optical detector 102. In the shown example, a plurality of through wafer vias 124 (TWVs) within the radiation-shielding wafer 106 are electrically coupled at a first end to the optical detector 102 and coupled at a second end to the CMOS ROIC 104. Specifically, each TWV 124 is electrically coupled via a corresponding wafer level bonding structure to an electrical connection 126 (e.g. contact) of the CMOS ROIC 104, and an electrical connection 128 (e.g. contact) of the optical detector 102. It should be noted that, as further described herein, in other examples the coupling between the optical detector 102 and the radiation-shielding wafer 106 may be in the form of indium bump bonding rather than a direct wafer bond technique.

The optical detector 102 includes a plurality of pixels positioned so as to collect optical radiation incident thereon and provide a desired image spatial resolution. In various examples, each pixel is defined within the optical detector 102, and each pixel corresponds to an individual TWV 124 in the radiation-shielding wafer 106. The particular pixel architecture may vary based on the fabrication methodology employed, and may be vary based on the desired application. Each pixel may be sensitive to a particular wavelength of optical radiation. For example, each pixel may generate a charge responsive to receiving wavelengths of light ranging from as small as 0.1 µm up to 25 µm. In one implementation, the optical detector 102 may include a silicon PiN (SiPiN) detector array; however, in various other implementations the optical detector 102 may include a mercury cadmium telluride (HgCdTe) detector array or other suitable detector material. The optical detector 102 may include any suitable number of pixels arranged in a two-dimensional pattern of rows and columns.

As shown, the CMOS ROIC 104 may be in electrical communication with the optical detector 102 via the plurality of TWVs 124 extending through the radiation-shielding wafer 106. In certain examples, the CMOS ROIC 104 generates one or more signals based on the optical radiation collected by the optical detector 102 and the charge provided. Specifically, the CMOS ROIC 104 may include a plurality of unit cell amplifier circuits, each unit cell amplifier circuit being electrically coupled via a corresponding electrical connection 126 with a TWV 124. Each unit cell amplifier circuit of the CMOS ROIC 104 may include circuitry to interface, bias, and amplify one or more corresponding detector pixels. In some examples, additional ROIC circuitry may also be provided for high performance sensor operation and external device interfacing.

During operation, the CMOS ROIC 104 processes the charge generated by the optical detector 102 to provide one or more output signals (i.e., read-out values) to downstream components. In particular examples, the output signal depends on the intensity of the flux of the electromagnetic radiation collected by the optical detector 102 over the integration time period. In various implementations, the CMOS ROIC 104 may include additional circuitry to digitize the output signal. Accordingly, in certain examples the sensor chip assembly 100 is a complete digital sensor chip assembly. In various examples, pixel array formats may range from 64 by 64 to 8,000 by 8,000 pixels, with pixel sizes ranging from 8 µm to 60 µm. However, other formats are within the scope of this disclosure and the provided examples are merely provided for the purpose of explanation.

In further examples, the unit cell amplifier circuits of the CMOS ROIC 104 may provide support for multiple gain settings, which may enable a large dynamic range when compared to the performance capabilities of typical sensor chip assembly arrangements. Further, such an arrangement ensures a constant optimal setting for detector biases within the CMOS ROIC 104 avoiding the non-linearity effects of typical SFD arrangements.

In the shown example of FIG. 1, the sensor chip assembly 100 may include a radiation-shielding wafer 106 interposed between the optical detector 102 and the CMOS ROIC 104. In particular, the radiation-shielding wafer 106 may be physically and electrically coupled to the optical detector 102 and the CMOS ROIC 104. In certain examples, the radiation-shielding wafer 106 is configured to prevent the transmission of radiative emission from the CMOS ROIC 104 to the optical detector 102. However, in other examples, the radiation-shielding wafer 106 may be configured to prevent radiation transfer from the optical detector 102 to the CMOS ROIC 104. In some particular instances, the radiation-shielding wafer 106 is configured to prevent the transmission of radiative emission from the CMOS ROIC 104 to the optical detector 102, and also radiation transfer from the optical detector 102 to the CMOS ROIC 104. As discussed herein, the radiative emission, the radiative transfer, and more generally, the radiation, is radiation within the electromagnetic spectrum. While some examples may include visible light or infrared radiation, in other embodiments, the radiation may include gamma rays. As discussed above, specific examples of the radiative emission may include undesired photon emission from the operation of one or more MOSFET devices within the CMOS ROIC 104. In other instances, the radiation transfer may include man-made laser light or radiation sources produced within or outside of the earth's atmosphere.

While the particular spectra of radiative emission may vary depending on the environment, application, and/or the particular MOSFET device, in various implementations the radiation-shielding wafer 106 is configured to prevent radiative emission having a wavelength substantially between 0.8 μm and 2.4 μm from being received at the optical detector 102. In specific implementations, the wavelength range of interest may be between 0.8 μm and 1.2 μm. As discussed herein, in one example the radiation-shielding wafer 106 is composed of one or more materials which are configured to block the radiative transfer; however, in various other examples the radiation-shielding wafer 106 may be composed of one or more materials which are configured to absorb, or block and absorb the radiative transfer.

Figure 2:
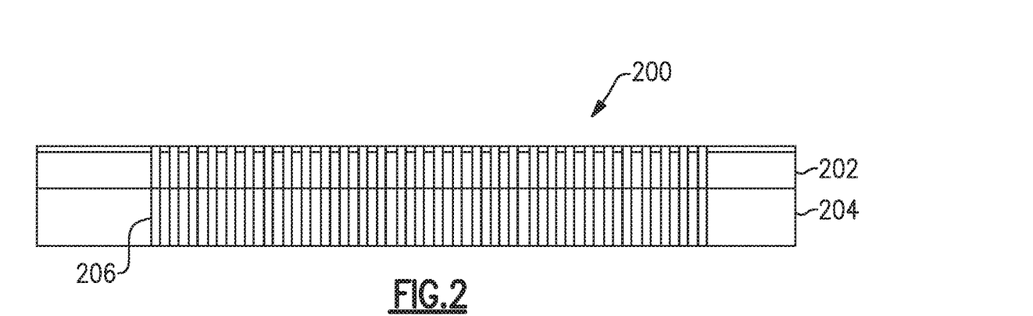
FIG. 2 is an example of a radiation-shielding wafer according to aspects described herein.

In certain examples, the composition and dimensions of the radiation-shielding wafer 106 are chosen relative to the spectra of radiative transfer that is desired to be blocked, as well as, the spectral sensitivity of the optical detector 102. Referring to FIG. 2, FIG. 2 illustrates a more detailed view of a radiation-shielding wafer 200 according to various implementations. In the illustrated example, the radiation-shielding wafer 200 may include a semiconductor absorber 202 deposited on a silicon wafer 204. In such an arrangement, a plurality of TWVs 206 may extend through the semiconductor absorber 202 and through the silicon wafer 204. The semiconductor absorber 202 may be any one of germanium (Ge), indium gallium arsenide (InGaAs), indium arsenide (InAs), indium antimonide (InSb), and mercury cadmium telluride (HgCdTe). However, in various other implementations other materials may be used. In certain examples, the dimensions of the radiation-shielding wafer 200 substantially match the length and width of the CMOS ROIC (e.g., CMOS ROIC 104) to ensure that all undesired radiative transfer is blocked and/or absorbed. In one example, the thickness of the radiation-shielding wafer 200 is 50 μm, or less, and may depend on the absorption needs of the corresponding sensor chip assembly.

Figure 3:
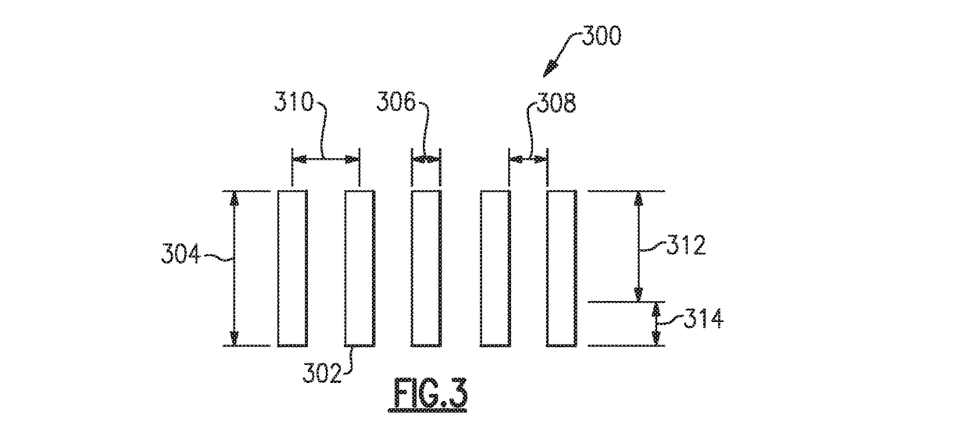
FIG. 3 is an example of through wafer vias according to aspects described herein.

Referring to FIG. 1, the radiation-shielding wafer 106 includes a plurality of TWVs 124. Each TWV 124 of the plurality extends from the first surface 114 of the radiation-shielding wafer 106 to the second surface 118 of the radiation-shielding wafer 106 through a thickness of the radiation-shielding wafer 106. As shown in FIG. 1, the radiation-shielding wafer 106 may be coupled to the detector 102 at the second surface 118, and coupled to the ROIC 104 at the first surface 114. In certain examples, each TWV 124 includes an etched hole filled with an electrically conductive material. In at least one example, the electrically conductive material is copper. Accordingly, each TWV 124 acts as an electrical conduit communicating charge from the one or more pixels of the optical detector 102 to one or more unit cells of the CMOS ROIC 104. FIG. 3 shows one example of a plurality of TWVs 302, such as the TWVs 124 shown in FIG. 1, according to certain examples.

Referring to FIG. 3, each TWV 302 may be defined by a length, a width, and a height. For the convenience of illustration, only the height 304 and width 306 of the TWVs 302 are shown in the example of FIG. 3. Further, each TWV 302 of the plurality may be spaced apart by a distance 308 and a pitch 310. As discussed with reference to FIG. 2, in various examples, the radiation-shielding wafer may include a semiconductor absorber and a silicon wafer (e.g., absorber 202 and wafer 204). Accordingly, in the illustration of FIG. 3, height 312 represents the height of each TWV 302 within the silicon wafer, and height 314 represents the height of each TWV 302 within the semiconductor absorber. In one example, the width 306 of each TWV 302 may be between about 2 μm and 5 μm, the height 304 of each TWV 302 may be between about 10 μm to 50 μm, the pitch 310 of the plurality of TWVs 302 may be about 18 μm, and the distance 308 between each TWV 302 may be between about 11 μm to 16 μm. In such an arrangement, each TWV 302 may have a height 312 within a range of 5 μm to 45 μm within the silicon wafer, and a height 314 within a range of about 5 μm (or less) within the semiconductor absorbing layer.

Figure 4A:
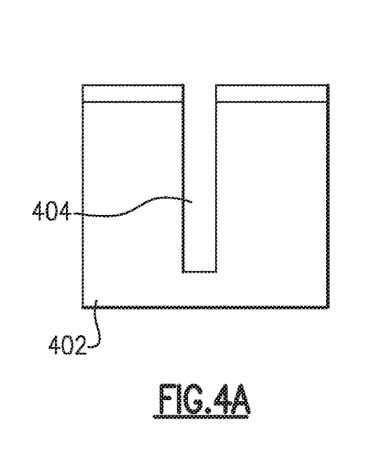
FIGS. 4A-4D are stages of a radiation-shielding wafer during an example process for creating a through wafer via, according to aspects described herein.
Figure 4B:
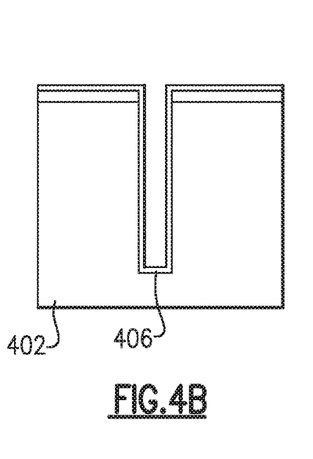
Figure 4C:
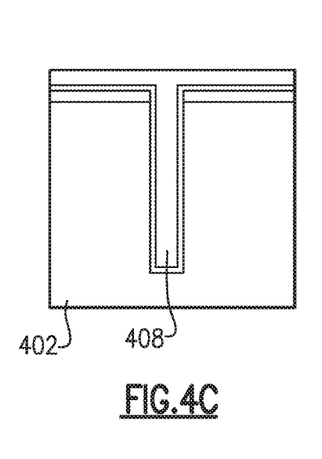
Figure 4D:
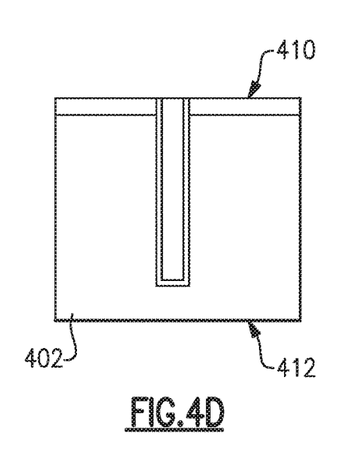

Referring to FIGS. 4A-4D, illustrated are stages of a radiation-shielding wafer 402 according to a process for creating a through wafer via (e.g., through wafer via (TWV) 124 shown in FIG. 1), according to certain aspects. Referring to FIG. 4A, the process may include etching (e.g., drilling) at least one hole 404 through the radiation-shielding wafer 402. As discussed above, in various implementations the radiation-shielding wafer 402 may include a silicon wafer and a semiconductor absorber, and accordingly, the process may include drilling through both. In FIG. 4B, the process for forming a TWV may include insulating and seeding the etched hole within the radiation-shielding wafer 402 with an insulating layer 406. In FIG. 4C, the process may then include filling the etched hole with an electrically conductive material 408, such as copper, or another suitable conducting material (e.g., silver, gold, aluminum, etc.). Once the one or more etched holes 404 are filled, the process may include performing a chemical-mechanical planarization process to smooth the top surface 410 (e.g., relative to the radiation-shielding wafer 402) of the formed TWV and remove any excess electrically conductive material. FIG. 4D shows one example of a radiation-shielding wafer 402 including a finished TWV. In some instances, following the formation of the TWVs, excess material on a bottom surface 412 of the radiation-shielding wafer 402 (e.g., shown beneath the formed TWV in FIG. 4D) is removed to expose the TWV on the bottom side. The radiation-shielding wafer 402 may then be planarized on both the top and bottom sides 410, 412. FIGS. 4A-4D are illustrative of one example of a process for forming a TWV; however, in certain other examples, other suitable processes for forming TWVs within an radiation-shielding wafer may be performed.

Figure 5:
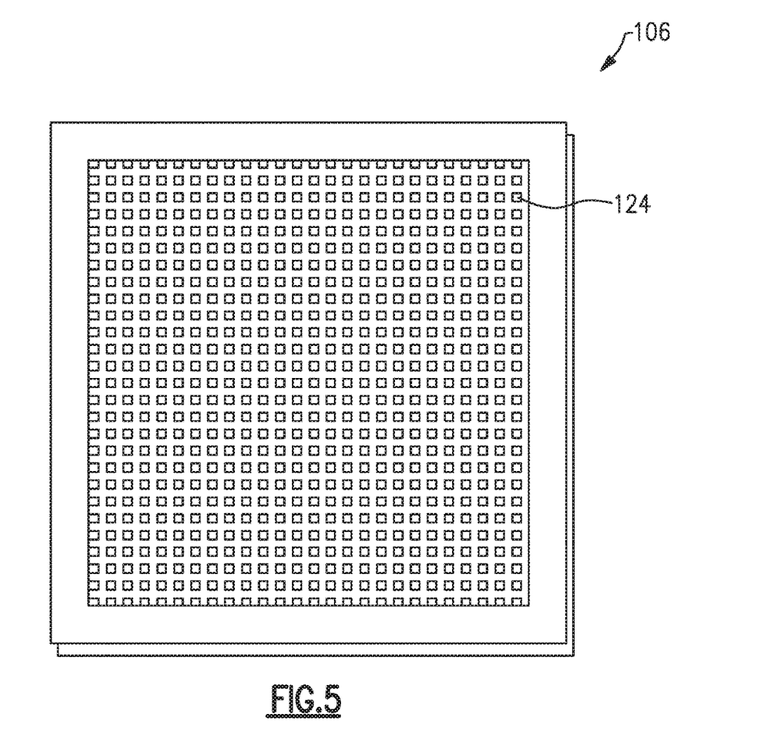
FIG. 5 is a top view of another example of a radiation-shielding wafer according to aspects described herein.

In certain examples, the plurality of TWVs 124 of the sensor chip assembly 100 illustrated in FIG. 1 may be arranged in a two-dimensional array. Specifically, the plurality of TWVs 124 may be arranged in a pattern which substantially matches a layout of the one or more pixels of the optical detector 102. Referring to FIG. 5, FIG. 5 illustrates a top view of the radiation-shielding wafer 106 according to certain examples. In FIG. 5, the plurality of TWVs 124 are arranged in a two-dimensional grid of rows and columns. However, in various other examples, any suitable regular or irregular pattern of TWVs 124 may be used. In particular, the arrangement of TWVs 124 may correspond to an arrangement of the one or more pixels of the optical detector 102.

Referring to FIG. 1, in certain examples the CMOS ROIC 104 includes a plurality of electrical connections 126 (e.g., contacts). For example, each electrical connection 126 may correspond to at least one unit cell amplifier circuit of the CMOS ROIC 104. In the illustrated example, the CMOS ROIC 104 is physically coupled with the radiation-shielding wafer 106 via the first and second wafer level bonding structures 108, 112. Each wafer level bonding structure 108, 112 may include a plurality of traces (traces 132 and traces 134, respectively) that electrically couple the TWVs 124 to the plurality of electrical connections 126. As shown in FIG. 1, the traces 132, 134 may be interposed between the TWVs 124 and the electrical connections 126. For example, the traces 132, 134 may include aluminum (Al) traces. In various examples, the first and second wafer level bonding structures 108, 112 between the CMOS ROIC 104 and the radiation-shielding wafer 106 form a direct oxide bond between the CMOS ROIC 104 and the radiation-shielding wafer 106.

Similarly, the optical detector 102 may include a plurality of electrical connections 128 (e.g., contacts). For example, each electrical connection 128 may correspond to at least one pixel of the optical detector 102. In the illustrated example, the optical detector 102 is physically coupled with the radiation-shielding wafer 106 via the third and fourth wafer level bonding structures 116, 120. Each wafer level bonding structure 116, 120 may include a plurality of traces (traces 136 and traces 138, respectively) that electrically couple the TWVs 124 to the plurality of electrical connections 128. As shown, the traces 136, 138 may be interposed between the TWVs 124 and the electrical connections 128. For example, the traces 136, 138 may also include aluminum (Al) traces. In various examples, the third and fourth wafer level bonding structures 116, 120 between the optical detector 102 and the radiation-shielding wafer 106 form a direct oxide bond between the optical detector 102 and the radiation-shielding wafer 106.

Figure 6:
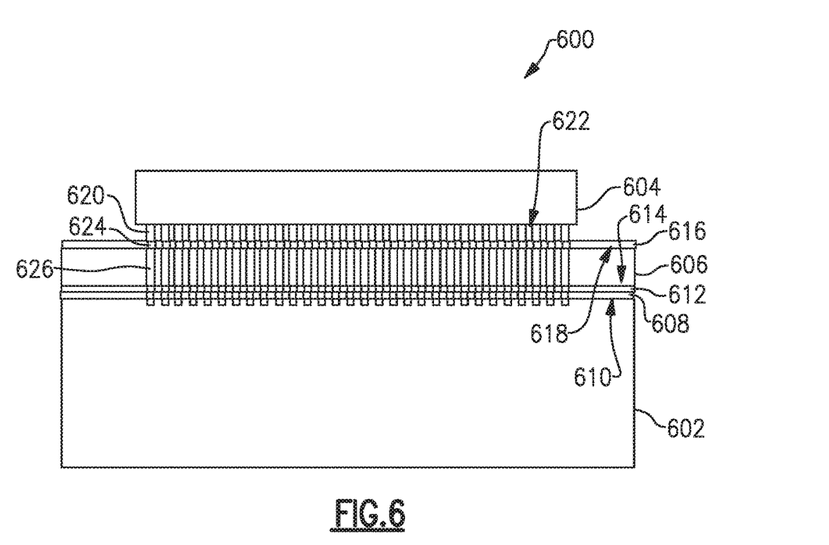
FIG. 6 is another example of a sensor chip assembly according to aspects described herein.

While a direct oxide bond may be suitable for certain types of optical detectors, in various implementations, the sensor chip assembly 100 may include other types of bonding structures to couple the optical detector 102 and the radiation-shielding wafer 106. Referring to FIG. 6, illustrated is another example of a sensor chip assembly 600 according to these aspects and implementations. As shown, the example sensor chip assembly 600 of FIG. 6 may include components similar to those included in the example sensor chip assembly 100 illustrated in FIG. 1.

For example, the sensor chip assembly 600 may include a CMOS ROIC 602, an optical detector 604, and a radiation-shielding wafer 606 interposed there between. The CMOS ROIC 602 and the radiation-shielding wafer 606 are similar to the CMOS ROIC 102 and the radiation-shielding wafer 106 discussed above with reference to FIG. 1. The sensor chip assembly 600 may further include a first wafer level bonding structure 608 fabricated on a surface 610 of the CMOS ROIC 602, a second wafer level bonding structure 612 fabricated on a first surface 614 of the radiation-shielding wafer 606, and a third wafer level bonding structure 616 fabricated on a second surface 618 of the radiation-shielding wafer 606. Each of the first, second, and third wafer level bonding structures 608, 612, 616 may be similar to the corresponding wafer level bonding structure (e.g., bonding structure 108, 112, 116) discussed with reference to FIG. 1. In various examples, the optical detector 604 may also include a plurality of indium bumps 620 disposed on contacts on the surface of the optical detector 604.

In the illustrated example, the optical detector 604 is physically and electrically coupled with the radiation-shielding wafer 606 by the plurality of indium bumps 620. Specifically, each indium bump 620 is bonded to a corresponding contact 624 within the third wafer level bonding structure 616. The corresponding contact 624 is then coupled at an opposite end to a TWV 626 within the radiation-shielding wafer 606. In particular examples, the sensor chip assembly 600 may provide improved functionality for infrared detectors. Accordingly, the optical detector 604 illustrated in FIG. 6 may include any suitable infrared detector, such as a mercury cadmium telluride (HgCdTe) detector.

As discussed herein, various aspects and examples include a sensor chip assembly for reducing undesired radiative transfer within an imaging device. Specifically, aspects and examples prevent the collection of undesired radiative emission that is fundamental to CMOS ROICs within an imaging device, as well as, radiation transfer from the optical detector to the CMOS ROIC. Referring now to FIGS. 7A-7D, each of FIGS. 7A-7D illustrates a stage of assembly according to one example of a process for manufacturing an improved sensor chip assembly.

With reference to FIGS. 7A-7D the process of manufacturing a sensor chip assembly, such as the sensor chip assembly 100 shown in FIG. 1, may include the acts of providing an radiation-shielding wafer, providing a CMOS ROIC, fabricating a first wafer level bonding structure on a first surface of the CMOS ROIC, fabricating a second wafer level bonding structure on a first surface of the radiation-shielding wafer, and forming a first direct oxide bond between the first wafer level bonding structure and the second wafer level bonding structure to electrically and physically couple to an radiation-shielding wafer and the CMOS ROIC. Further acts included within the example manufacturing process are further discussed below with reference to FIGS. 7A-7D.

Figure 7A:
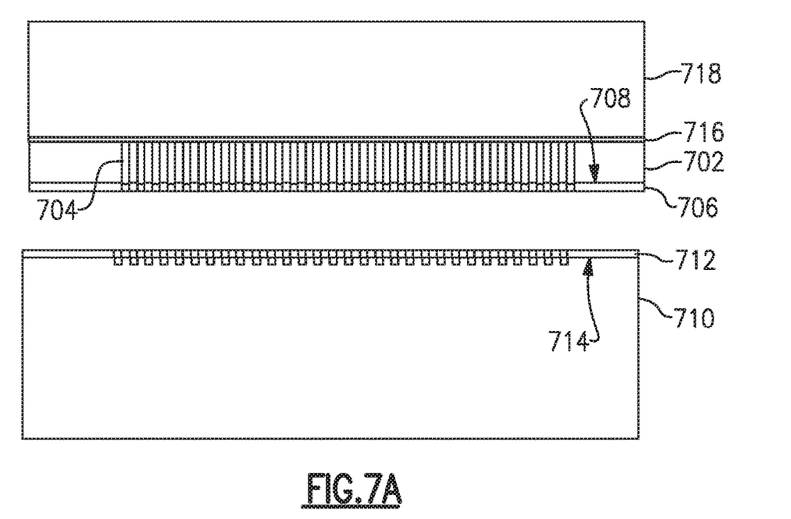
FIGS. 7A-7D are stages of a sensor chip assembly during an example of a process for manufacturing a sensor chip assembly, according to aspects described herein.

FIG. 7A shows one example of a provided radiation-shielding wafer 702 having a plurality of TWVs 704 and a first wafer level bonding structure 706 fabricated on a first surface 708 thereof. FIG. 7A further shows an example of a provided CMOS ROIC 710 having a second wafer level bonding structure 712 fabricated on a surface 714 thereof. As discussed with reference to at least FIG. 1, in various examples the radiation-shielding structure 702 may include a thin silicon wafer (e.g., less than 50 μm) with a semiconductor absorber deposited thereon. Accordingly, in various examples, and as shown in FIG. 7A, the process of manufacturing the sensor chip assembly may include providing the radiation-shielding wafer 702 coupled via a silicon-on-insulator 716 interface to a handling wafer 718 to facilitate safe and convenient transportation.

In various examples, the act of providing the radiation-shielding wafer 702 may include providing a silicon wafer having a semiconductor absorber deposited thereon, etching a plurality of holes through the silicon wafer and the semiconductor absorber, and filling each hole of the plurality of holes with an electrically conductive material. One example of such a process is further described above with reference to FIGS. 4A-4D. In particular, the act of filling each hole of the plurality with an electrically conductive material may include filling each hole with copper. Holes may be etched in any suitable pattern, and in certain implementations, may be etched in a regular or irregular two-dimensional pattern (e.g., grid).

Figure 7B:
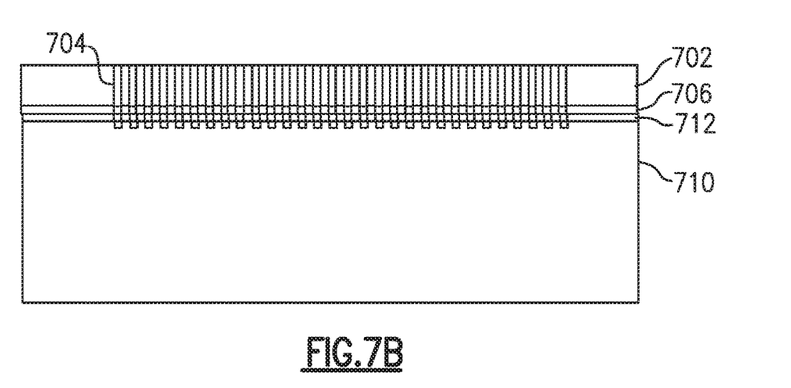

FIG. 7B shows one example of the radiation-shielding wafer 702 physically coupled with the CMOS ROIC 710. In various examples, the process of manufacturing the sensor circuit assembly may include forming a first direct oxide bond between the first wafer level bonding structure 706 and the second wafer level bonding structure 712 to electrically and physically couple to the radiation-shielding wafer 702 and the CMOS ROIC 710. Once the first direct oxide bond has been formed, the process may include the act of removing the handling wafer 718 coupled to the radiation-shielding wafer 702. As further shown in FIG. 7B, when forming the bond between the first and second wafer level bonding structures 706, 712 the first and second wafer level bonding structures 706, 712 may be positioned such that traces within each of the first and second wafer level bonding structures 706, 712 are aligned when the bond is formed. Such traces may be used to electrically couple the CMOS ROIC 710 to the TWVs 704.

Figure 7C:
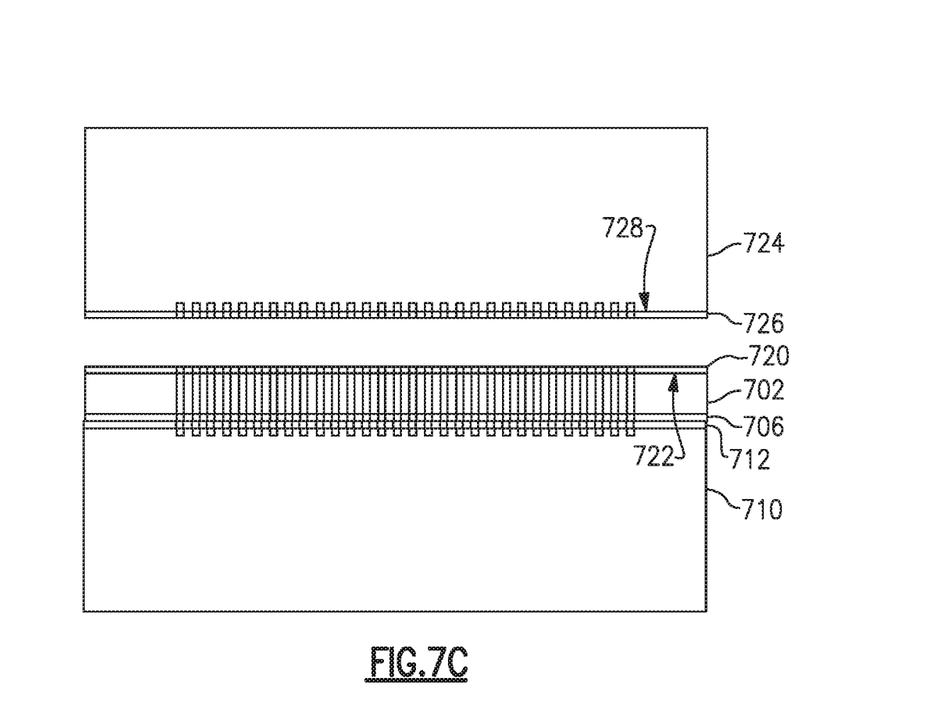

Referring to FIG. 7C, once the radiation-shielding wafer 702 has been physically and electrically coupled to the CMOS ROIC 710, the process may include the act of fabricating a third wafer level bonding structure 720 on a second surface 722 of the radiation-shielding wafer 702. As shown, the second surface 722 may be on an opposite side of the radiation-shielding wafer 702 relative to a position of the CMOS ROIC 710. In various examples, the second wafer level bonding structure 720 of the radiation-shielding wafer 702 may be used to physically and electrically couple the radiation-shielding wafer 702 and the optical detector 724. While in one example the process may further include the act of fabricating a fourth wafer level bonding structure 726 on a surface 728 of optical detector 724, in certain other examples, other bonding structures may be used. For example, in one implementation the process may include fabricating a plurality of indium bumps on the surface 728 of the radiation-shielding wafer 702.

Figure 7D:
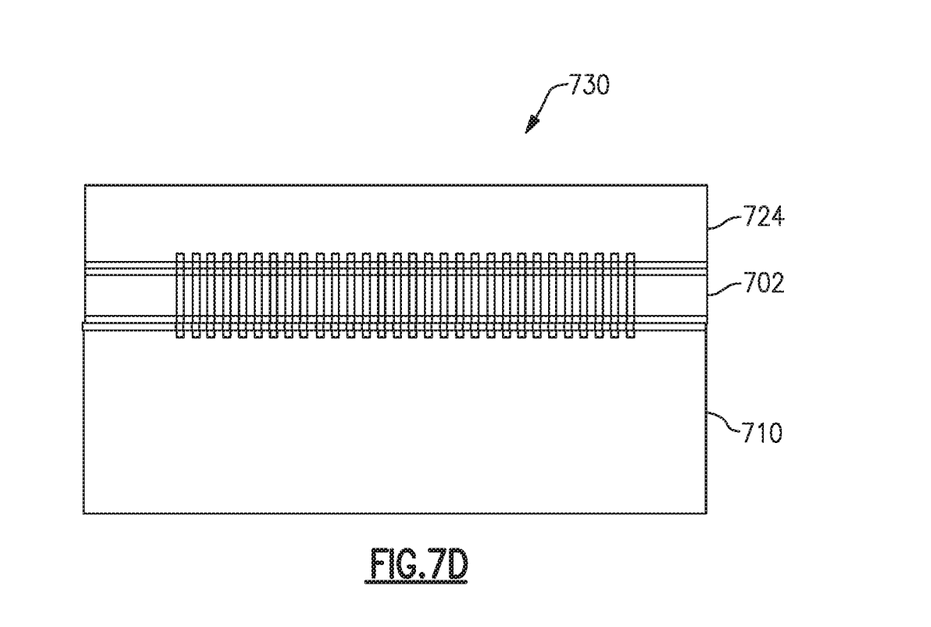

Once the third wafer level bonding structure 720 is fabricated on the surface of the radiation-shielding wafer 702, the process may include physically and electrically coupling the radiation-shielding wafer 702 and the optical detector 724. In one example, the act of physically and electrically coupling the radiation-shielding wafer 702 and the optical detector 724 may include forming a second direct oxide bond between the third wafer level bonding structure 720 and the fourth wafer level bonding structure 726. However, in certain other examples, the process may include forming a bond between a plurality of indium bumps fabricated on the optical detector 724 and the third wafer level bonding structure 720. As further shown in FIG. 7C, when forming the bond between the third and fourth wafer level bonding structure 720, 726 the third and fourth wafer level bonding structure 720, 726 may be positioned such that traces within each of the third and fourth wafer level bonding structure 720, 726 are aligned when the bond is formed. Such traces may be used to electrically couple the optical detector 724 to the TWVs 704. FIG. 7D shows one example of a complete sensor chip assembly 730 manufactured according to processes discussed herein.

Accordingly, various aspects and examples discussed herein provide an improved structure for preventing the transfer of radiative energy between a CMOS ROIC and an optical detector. In at least one example, a radiation-shielding wafer interposed between the optical detector and the CMOS ROIC allows electrical communication between the CMOS ROIC and the optical detector while preventing the transfer of the undesired radiative energy. Such aspects and examples provide important functionality for numerous low-background applications, such as low-background imaging astronomy applications, as well as, functionality for increased operational capability in hostile optical and radiation environments.

Having described above several aspects of at least one example, it is to be appreciated various alterations, modifications, and improvements will readily occur to those skilled in the art. Such alterations, modifications, and improvements are intended to be part of this disclosure and are intended to be within the scope of the invention. Accordingly, the foregoing description and drawings are by way of example only, and the scope of the invention should be determined from proper construction of the appended claims, and their equivalents.

What is claimed is:
1. A sensor chip assembly comprising:
   an optical detector configured to collect electromagnetic radiation incident thereon;
   a complementary metal-oxide semiconductor (CMOS) read-out integrated circuit (ROIC); and
   a radiation-shielding wafer interposed between the optical detector and the CMOS ROIC, the radiation-shielding wafer including a semiconductor absorber deposited on a silicon wafer and a plurality of through wafer vias (TWVs) electrically coupled to the optical detector and the CMOS ROIC, the radiation-shielding wafer being positioned to prevent radiative transfer between the CMOS ROIC and the optical detector.
2. The sensor chip assembly according to claim 1, wherein the radiation-shielding wafer is physically coupled to the optical detector and the CMOS ROIC.
3. The sensor chip assembly according to claim 2, wherein each of the plurality of TWVs includes an etched hole filled with an electrically conductive material within the radiation-shielding wafer to electrically couple the optical detector and the CMOS ROIC.
4. The sensor chip assembly according to claim 3, wherein the electrically conductive material is copper.
5. The sensor chip assembly according to claim 4, wherein the plurality of TWVs are arranged in a two-dimensional array within the radiation-shielding wafer.
6. The sensor chip assembly according to claim 1, wherein the semiconductor absorber is composed of at least one of germanium (Ge), indium gallium arsenide (InGaAs), indium arsenide (InAs), indium antimonide (InSb), and mercury cadmium telluride (HgCdTe).
7. The sensor chip assembly according to claim 1, wherein the radiation-shielding wafer is configured to prevent radiative transfer within the electromagnetic spectrum.
8. The sensor chip assembly according to claim 7, wherein the radiative transfer includes infrared radiation having a wavelength between 0.8 μm and 2.4 μm.
9. The sensor chip assembly according to claim 1, wherein the CMOS ROIC includes a first plurality of electrical connections, the optical detector includes a second plurality of electrical connections, and the plurality of TWVs elec- trically couple the first plurality of electrical connections of the CMOS ROIC with the second plurality of electrical connections of the optical detector.

10. The sensor chip assembly according to claim 9, wherein each TWV of the plurality of TWVs is bonded to a corresponding first electrical connection of the first plurality of electrical connections with a first wafer level bonding structure, and wherein each TWV of the plurality of TWVs is bonded to a corresponding second electrical connection of the second plurality of electrical connections with a second wafer level bonding structure.

11. The sensor chip assembly according to claim 10, wherein the first wafer level boding structure forms a first direct oxide bond and the second wafer level bonding structure forms a second direct oxide bond.

12. The sensor chip assembly according to claim 1, wherein each TWV of the plurality of TWVs is bonded to the optical detector with an indium bump.

13. A method of manufacturing a sensor chip assembly, the method comprising:
 providing a radiation-shielding wafer including a semiconductor absorber deposited on a silicon wafer and a plurality of through wafer vias (TWVs);
 providing a complementary metal-oxide semiconductor (CMOS) read-out integrated circuit (ROIC);
 fabricating a first wafer level bonding structure on a first surface of the CMOS ROIC;
 fabricating a second wafer level bonding structure on a second surface of the radiation-shielding wafer; and
 forming a first direct oxide bond between the first wafer level bonding structure and the second wafer level bonding structure to electrically and physically couple to the radiation-shielding wafer and the CMOS ROIC.

14. The method according to claim 13, further comprising:
 providing an optical detector configured to collect electromagnetic radiation incident thereon;
 fabricating a third wafer level bonding structure on a third surface of the radiation-shielding wafer; and
 fabricating a fourth wafer level bonding structure on a fourth surface of the optical detector.

15. The method according to claim 14, further comprising:
 forming a second direct oxide bond between the third wafer level bonding structure and the fourth wafer level bonding structure to electrically and physically couple to the radiation-shielding wafer and the optical detector.

16. The method according to claim 13, wherein providing the radiation-shielding wafer includes:
 etching a plurality of holes through the silicon wafer and the semiconductor absorber; and
 filling each hole of the plurality of holes with an electrically conductive material.

17. The method according to claim 16, wherein filling each hole of the plurality of holes with an electrically conductive material includes filling each hole with copper.

18. The method according to claim 17, wherein etching a plurality of holes through the silicon wafer and the semiconductor absorber includes etching a two-dimensional array of holes.

19. The method according to claim 13, wherein the radiation-shielding wafer is coupled via a silicon-on-insulator interface to a handling wafer, the method further comprising removing the handling wafer responsive to forming the first direct oxide bond.

* * * * *